United States Patent
Kuo et al.

[11] Patent Number: 5,709,755
[45] Date of Patent: Jan. 20, 1998

[54] METHOD FOR CMP CLEANING IMPROVEMENT

[75] Inventors: So Wein Kuo, Hsin-chu; Tsu Shih, Chahwag; Chung-Long Chang, Dou-Liu, all of Taiwan

[73] Assignee: Taiwan Semiconductor Manufacturing Company, Ltd., Hsin-chu, Taiwan

[21] Appl. No.: 694,728

[22] Filed: Aug. 9, 1996

[51] Int. Cl.$^6$ .......................... H01L 21/304; H01L 21/30
[52] U.S. Cl. .......................... 134/1.3; 216/89; 438/693
[58] Field of Search .................. 216/88, 89; 156/636.1; 134/1.3; 438/691, 692, 693

[56] References Cited

U.S. PATENT DOCUMENTS

| | | | |
|---|---|---|---|
| 5,317,778 | 6/1994 | Kudo et al. | 15/88.3 |
| 5,320,706 | 6/1994 | Blackwell | 156/636 |
| 5,441,591 | 8/1995 | Imthurn et al. | 156/153 |
| 5,606,251 | 2/1997 | Ryle et al. | 324/158.1 |

FOREIGN PATENT DOCUMENTS

| | | |
|---|---|---|
| 04-042893 | 2/1992 | Japan. |
| 07-066161 | 3/1995 | Japan. |

OTHER PUBLICATIONS

"Mechanical Brush Scrubbing for Post-CMP Clean"; Krussell et al.; Solid State Tech., vol. 38, No. 6, pp. 109-114; Jun. 1995.

*Primary Examiner*—R. Bruce Breneman
*Assistant Examiner*—George Goudreau
*Attorney, Agent, or Firm*—George O. Saile; Stephen B. Ackerman

[57] ABSTRACT

Using an APM solution to clean both the front and backside of a semiconductor wafer significantly reduces the residue from chemical mechanical polishing. A low residue count holds the wafer more securely to the electrostatic chuck, thus improving processing, reducing wear on the electrostatic chuck, and increasing its lifetime.

15 Claims, 1 Drawing Sheet

METHOD FOR CMP CLEANING IMPROVEMENT

BACKGROUND OF THE INVENTION

1. Field of the Invention

The invention relates to the field of chemical mechanical polishing (CMP) of a wafer, and more particularly to the removal of CMP residue.

2. Description of the Prior Art

CMP for planarization of semiconductor wafers is widely used in the manufacture of integrated circuits. One step in the processing of a wafer is the removal of the CMP residue. This step is becoming more important as integrated circuit structures are getting smaller and smaller.

An example of the cleaning process of prior art is shown in U.S. Pat. No. 5,320,706 (Blackwell, June 1994). Here the semiconductor wafer is polished on a rotating platen by a polishing pad and slurry. Then the wafer is rinsed. To remove as much as possible of the remaining residue, and while still on the platen, a mixture of a surfactant and deionized (DI) water is applied to a polishing pad and the pad is applied to the wafer. About 100 particles remained after a second rinse with DI water/surfactant. Apparently, only the front side of the wafer was cleaned.

SUMMARY OF THE INVENTION

It is an object of the present invention to reduce the CMP particle count on both sides of a semiconductor wafer as compared to prior art where only the front side was cleaned.

It is a further object of the present invention to more securely hold a semiconductor wafer to an electrostatic chuck (ESC) during etching.

It is yet another object of the present invention to improve the lifetime of the ESC by reducing abrasion and pitting on its surface.

These objects are achieved by a method of passing the wafer from a CMP polishing station to an APM rinse station (APM is a solution of ammonium hydroxide and hydrogen peroxide in water); brushing and rinsing (with APM) the wafer on both sides, thereby removing a large part of the CMP residue; next passing the wafer to a DI rinse station, and brushing and rinsing (with DI) the wafer on both sides, thereby removing yet more of the CMP residue. These objects are also achieved by an apparatus which has firstly an APM station with a set of rotating brushes and a set of pipes for delivering APM, to scrub and rinse both sides of the wafer and secondly a DI station with a set of rotating brushes and a set of pipes for delivering DI, to scrub and rinse both sides of the wafer.

With a significant reduction of CMP residue, the wafer is attracted more strongly to the ESC. Not only is the wafer held more securely for etching, but wear on the ESC is reduced, and the lifetime of the ESC is increased.

DESCRIPTION OF THE PREFERRED EMBODIMENT

Figure 1:
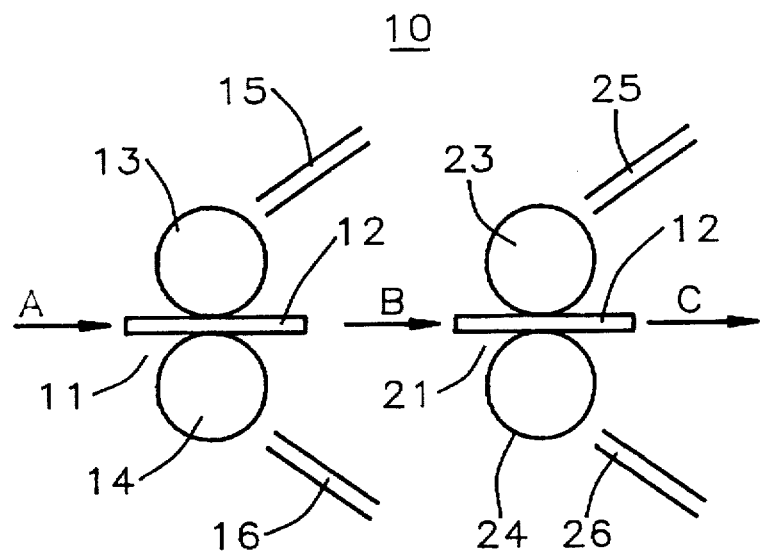
FIG. 1 is a side view of the two rinse stations of the present invention.

Referring now to FIG. 1, an apparatus 10 is shown for removing CMP residue from a semiconductor wafer. Coming from a CMP station (not shown) wafer 12 enters station 11 as shown by arrow A. Station 11 has a set of rotating brushes 13 and 14. The wafer is scrubbed on both sides by these brushes. Concurrently, CMP residue is flushed from both the front and back side of the wafer by applying a rinse of APM at rinse stations 15 (front of wafer) and 16 (back of wafer).

The APM solution is typically applied to both sides of the wafer at a rate of 500 ml per minute, but the rate may range from 300 to 700 ml per minute. The time the APM solution is applied to front and back side of the wafer is generally about 30 seconds, but may range from 20 to 40 seconds. Both rate and duration of delivery of APM solution may vary between the front and back of the wafer as necessary.

Wafer 12 then moves from station 11 to station 21 as indicated by arrow B. Station 21 has another set of rotating brushes 23 and 24. Remaining residue particles are removed from wafer 12 by brushing and applying a DI water rinse at rinse stations 25 (front side of wafer) and 26 ( back side of wafer). The DI water rinse is delivered to both sides of the wafer at a typical rate of 500 ml per minute, but may range from 300 to 700 ml per minute. DI water delivery to front and back side of the wafer tends to be about 30 seconds, but may range from 20 to 40 seconds. The wafer is then removed from station 21, as shown by arrow C.

Rinsing both sides of the wafer with APM in station 11, significantly reduces CMP particle residue count. The residue particle count for both front and back side of the wafer, after exiting DI station 21, is now typically less than 30, though it ranges from 10 to 30 particles.

Figure 2:
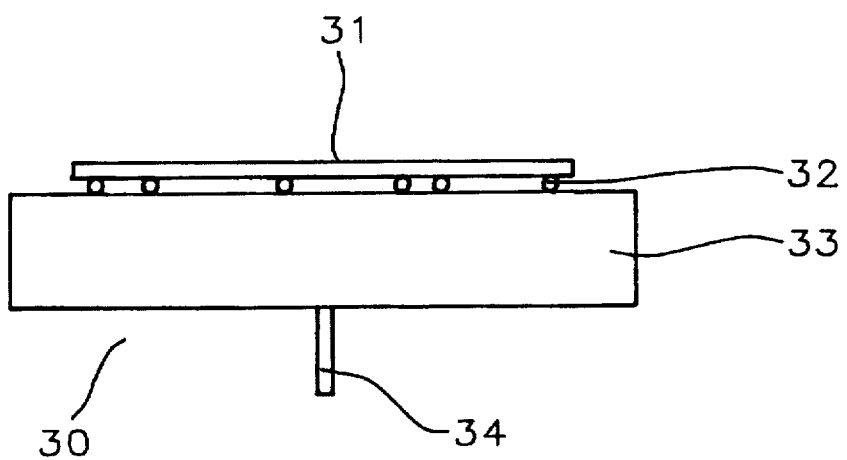
FIG. 2 is a side view of an electrostatic chuck assembly.

Some process steps later, after wafer 12 exits station 21, the wafer is mounted on the lower electrode of an ESC for the purpose of etching. In prior art the abundant residue particles on the back side of the wafer would cause the ESC to fail. The reduction of CMP particle residue improves the ability of the ESC to securely hold a semiconductor wafer by increasing the electrostatic attraction of the wafer to the ESC. FIG. 2 is a schematic side view of the lower electrode of the ESC assembly 30. Semi-conductor wafer 31, with CMP particle residue 32 adhering to its back side, is shown resting on top of the ESC 33. A high voltage direct current (DC) connection 34 is made to the ESC 33 away from the area of wafer 31. This DC voltage attracts the wafer to the chuck and holds the wafer in place.

With few CMP particles on the back side of wafer 31, the wafer is in direct contact with the top surface of the ESC 33, the high localized fields are replaced by a uniform field, and the wafer is attracted much more strongly by the ESC. Because the wafer is held much more securely, the chance of the wafer sliding around on the ESC and causing problems during etching is greatly reduced. Also eliminated is the possibility of the wafer falling off the ESC and damaging the wafer. A further benefit is the elimination of abrasion to the wafer caused by rubbing of the CMP particles against the wafer's back side.

Eliminating the strong localized electric fields and replacing them with a more uniform field increases the life time of the lower electrode of the ESC by reducing pitting and abrasion of the ESC surface under the wafer and diminishing the size of the damaged area.

The rotation of the brushes is typically 120 rpm, but may range from 100 to 140 rpm, without increasing the CMP particle count. The particle size of the CMP residue was found to be on the average 0.7 microns, but may range from 0.1 to 5 microns without affecting the reliability or lifetime of the ESC. The temperature of the APM solution is 25 deg. Centigrade, but can range from 20 to 30 deM. Centigrade without affecting the CMP particle count or affecting the wafer. The APM solution is a mixture of 14% ammonium hydroxide, 14% hydrogen peroxide and 72% water by volume.

While the invention has been particularly shown and described with reference to the preferred embodiments thereof, it will be understood by those skilled in the art that various changes in form and details may be made without departing from the spirit and scope of the invention.

What is claimed is:

1. A method for removing chemical mechanical polish residue from a semiconductor wafer, having front and back sides, comprising:

passing the wafer from a chemical mechanical polishing station to a first station having a first set of rotating brushes;

scrubbing said wafer on both sides with said first set of rotating brushes;

removing said residue from both sides of said wafer by applying a first rinse of a solution of ammonium hydroxide, hydrogen peroxide in water (APM) to both sides of said wafer;

passing said wafer from said first station to a second station having a second set of rotating brushes;

brushing said wafer on both sides with said second set of rotating brushes;

removing remaining residue particles from both sides of said wafer by applying a second rinse to both sides of the wafer; and removing said wafer from said second station.

2. The method of claim 1, wherein said solution of APM is delivered to the front side of the wafer at a rate ranging from 300 to 700 ml per minute.

3. The method of claim 1, wherein said solution of APM is delivered to the back side of the wafer at a rate ranging from 300 to 700 ml per minute.

4. The method of claim 1, wherein said solution of APM is delivered to the front side of the wafer for 20 to 40 seconds.

5. The method of claim 1, wherein said solution of APM is delivered to the back side of the wafer for 20 to 40 seconds.

6. The method of claim 1, wherein said solution of APM, delivered to the front side of the wafer, is a mixture of 14% ammonium hydroxide, 14% hydrogen peroxide and 72% water by volume.

7. The method of claim 1, wherein said solution of APM, delivered to the back side of the wafer, is a mixture of 14% ammonium hydroxide, 14% hydrogen peroxide and 72% water by volume.

8. The method of claim 1, wherein the temperature of said solution of APM, delivered to the front side of the wafer, ranges from 20 deg. Centigrade to 30 deg. Centigrade.

9. The method of claim 1, wherein the temperature of said solution of APM, delivered to the back side of the wafer, ranges from 20 deg. Centigrade to 30 deg. Centigrade.

10. The method of claim 1, wherein said second rinse comprises applying deionized water to the front side of the wafer.

11. The method of claim 1, wherein said second rinse comprises applying deionized water to the back side of the wafer.

12. The method of claim 10, wherein said deionized water is delivered to the front side of the wafer at a rate ranging from 300 to 700 ml per minute.

13. The method of claim 11, wherein said deionized water is delivered to the back side of the wafer at a rate ranging from 300 to 700 ml per minute.

14. The method of claim 10, wherein said solution of deionized water is delivered to the front side of the wafer for 20 to 40 seconds.

15. The method of claim 13, wherein said solution of deionized water is delivered to the back side of the wafer for 20 to 40 seconds.

* * * * *